(12) United States Patent
Park

(10) Patent No.: US 6,730,528 B1
(45) Date of Patent: May 4, 2004

(54) MASK SET FOR MEASURING AN OVERLAPPING ERROR AND METHOD OF MEASURING AN OVERLAPPING ERROR USING THE SAME

(75) Inventor: Ki Yeop Park, Seoul (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 08/999,401

(22) Filed: Dec. 22, 1997

(30) Foreign Application Priority Data

Dec. 28, 1996 (KR) .............................. 96-74999

(51) Int. Cl.[7] .............................................. H01L 21/00

(52) U.S. Cl. ......................................... 438/14; 382/144

(58) Field of Search ........................... 438/14; 382/144, 382/151; 716/19, 9; 355/403, 53, 76; 250/23 R

(56) References Cited

U.S. PATENT DOCUMENTS 3,497,705 A  *  2/1970  Adler ..................... 250/237 R
4,929,083 A     5/1990  Brunner

* cited by examiner

*Primary Examiner*—W. David Coleman
(74) *Attorney, Agent, or Firm*—Jacobson Holman PLLC

(57) ABSTRACT

A mask set for measuring an overlapping error according to the invention comprises a first mask consisted of a mask substrate on which a plurality of unit patterns are formed. The plurality of unit patterns are arranged in radial shape round a given center. The mask set of the present invention further comprises a second mask consisted of a mask substrate on which a plurality of unit patterns are formed. The plurality of unit patterns of the second mask are arranged in same shape as the plurality of unit patterns of the first mask, whereby when the first and second masks are overlapped to each other, the unit pattern of the first mark and the neighboring unit pattern of the second mask maintains a certain angle.

6 Claims, 5 Drawing Sheets

MASK SET FOR MEASURING AN OVERLAPPING ERROR AND METHOD OF MEASURING AN OVERLAPPING ERROR USING THE SAME

BACKGROUND OF THE INVENTION

1. Field of the Invention

The present invention relates to a mask set for measuring an overlapping error and method of measuring an overlapping error using the same. In particular, the present invention relates to a mask set for measuring an overlapping error and method of measuring an overlapping error which can identify an degree of overlapping error generated in all directions during the photolithography developing process and also can easily determine whether an overlapping error occurs or not even using a microscope having a low magnifying power.

2. Description of the Prior Art

As the integration of the semiconductor device becomes higher and smaller, the degree of overlapping alignment between an underlying layer and an upper layer or between an underlying layer and an impurity diffusion layer becomes an important factor in reliability of the device. Accordingly, a mask, on which a mark for measuring an overlapping error is formed, is commonly used to measure the degree of overlapping alignment.

FIG. 1 shows a conventional mask for measuring an overlapping error.

The mask for measuring an overlapping error is consisted of main patterns 1 and sub patterns 2 formed in the upper and underlying layer These patterns can measure an overlapping error created in only one direction of the X-axis or Y-axis direction. However, in case that an overlapping error created in both directions is measured, a measure operation are performed twice by this pattern. In addition, when a microscope having a high magnifying power is used and the patterns become more fined, a measuring error occurs frequently due to aberration of a lens and difference of a measuring point (eye) and a determining point of the measuring scale. Accordingly, although dedicated measurement equipments has been developed, there are problems that they are expensive in cost and a processing time is delayed.

SUMMARY OF THE INVENTION

It is an object of the present invention to provide a mask set for measuring an overlapping error which can identify an overlapping error generated not only in the X-axis and Y-axis directions but also in all directions during the photolithography developing process and also can easily determine an overlapping error even using a microscope having a low magnifying power.

To achieve these objects, a mask set for measuring an overlapping error according to the invention comprises a first mask consisted of a mask substrate on which a plurality of unit patterns are formed. The plurality of unit patterns are arranged in radial shape round a given center.

The mask set of the present invention further comprises a second mask consisted of a mask substrate on which a plurality of unit patterns are formed. The plurality of unit patterns of the second mask are arranged in same shape as the plurality of unit patterns of the first mask, whereby when the first and second masks are overlapped to each other, the unit pattern of the first mark and the neighboring unit pattern of the second mask maintains a certain angle.

A method of measuring an overlapping error according to the present invention comprises the steps of forming first measuring patterns on a wafer using a first mask on which a plurality of unit patterns are arranged in radial shape round a given center; forming overlapping second measuring patterns on said wafer using a second mask on which a plurality of unit patterns are arranged in same shape as the plurality of unit patterns of the first mask, whereby the first measuring patterns formed by the first mask and the second measuring patterns formed by the second mask maintains a certain angle; identifying an overlapping error between the first measuring patterns and said second measuring patterns; calculating a value of the overlapping error.

BRIEF DESCRIPTION OF THE DRAWINGS

Other objects and advantages of the present invention will be understood by reading the detailed explanation of the embodiment with reference to the accompanying drawings in which.

DETAILED DESCRIPTION OF THE INVENTION

Figure 1:
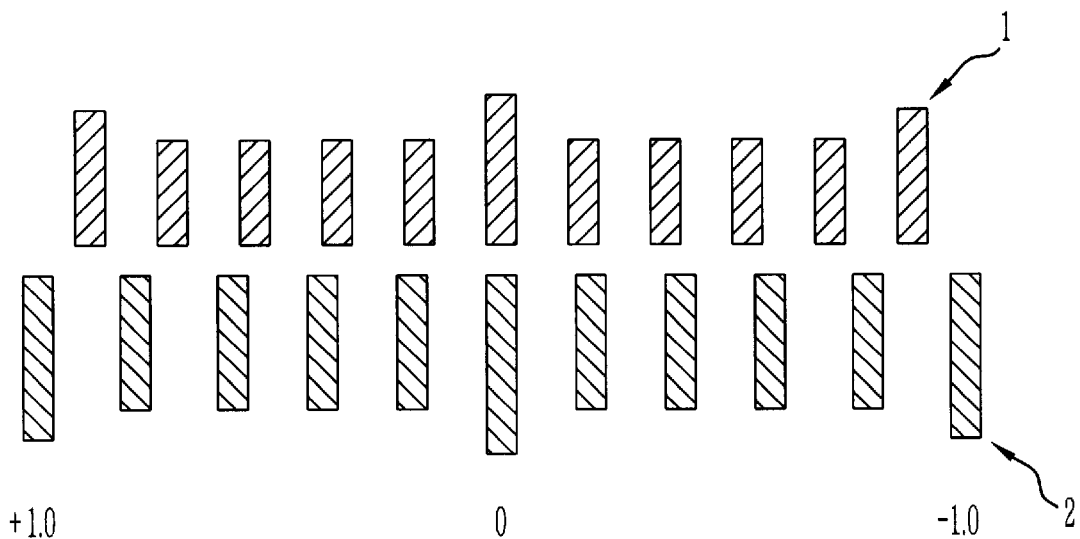
FIG. 1 shows a conventional pattern for measuring an overlapping error.
Figure 2:
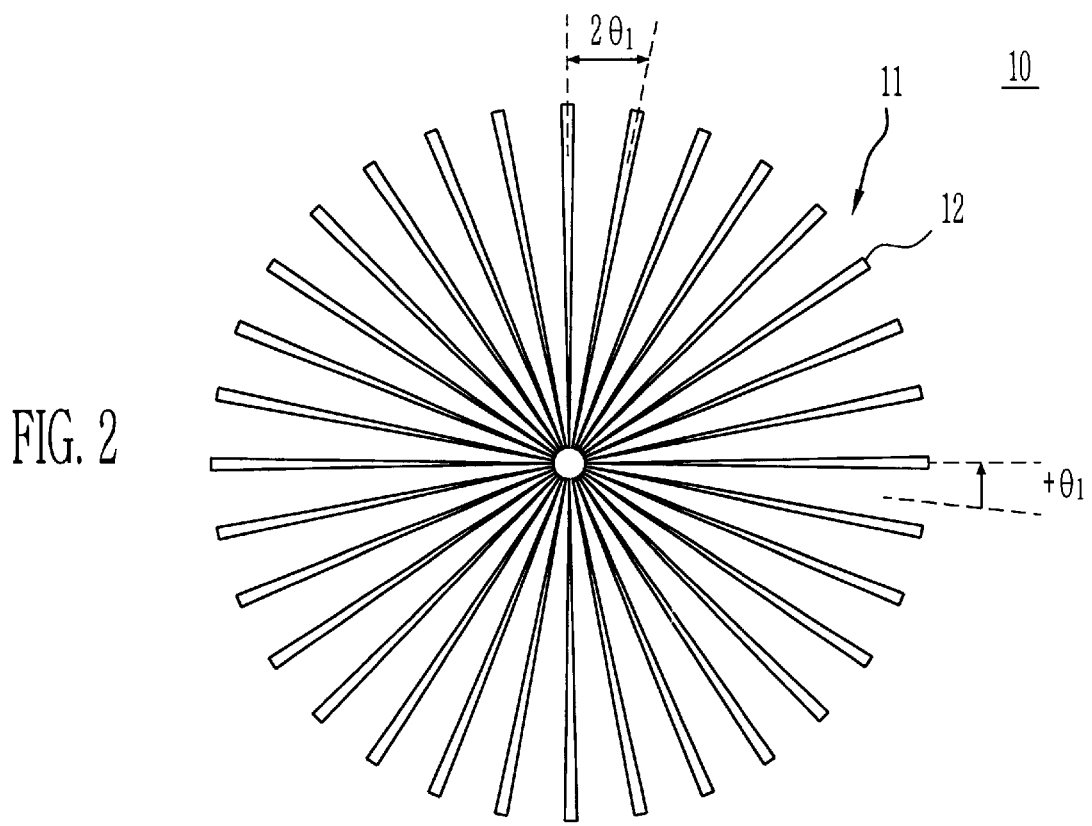
FIG. 2 is a plan view of a first mask for measuring an overlapping error according to the present invention.

FIG. 2 is a plan view of a first mask for measuring an overlapping error according to the present invention.

A first mask 10 is consisted of a plurality of unit patterns 12 which are formed on a mask substrate 11. The plurality of unit patterns 12 are extended radially round a give center. Two unit patterns 12 which are adjacent from each other form an angle of $2\theta_1$.

Figure 3:
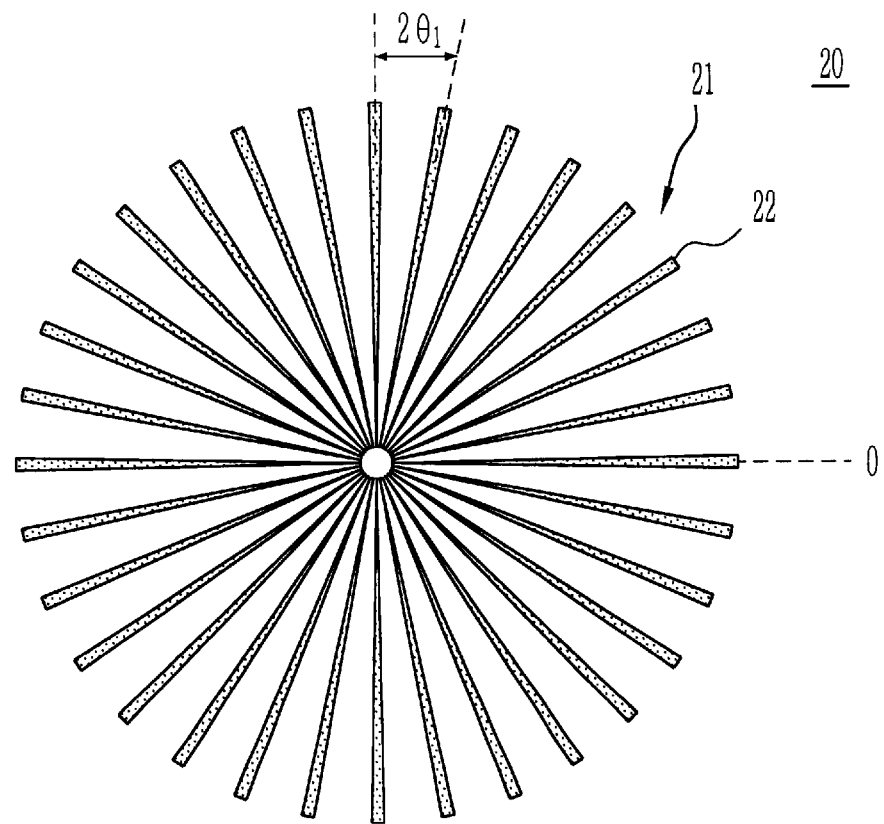
FIG. 3 is a plan view of a second mask for measuring an overlapping error according to the present invention.

FIG. 3 is a plan view of a second mask for measuring an overlapping error according to the present invention.

A second mask 20 is consisted of a plurality of unit patterns 22 which are formed on a mask substrate 21. The plurality of unit patterns 22 are extended radially round a give center. Two unit patterns 22 which are adjacent from each other form an angle of $2\theta_1$.

In the first or second masks 10 or 20, an angle of $2\theta_1$ between the neighboring unit patterns 12 or 22 is in the range between 0° and 90°. The unit patterns 12 and 22 are a dark pattern made of materials such as chrome or a clear pattern such as quartz forming a mask substrate.

When the first and second masks 10 and 20 are overlapped to each other, an angle between the one unit pattern 12 of the first mark 10 and the neighboring unit pattern 22 of the second mask 20 is $\theta_1$. That is, an angle between the one unit pattern 12 of the first mask 10 and the neighboring unit pattern 22 of the second mask 20 is in the range between 0° and 45°.

Figure 4A:
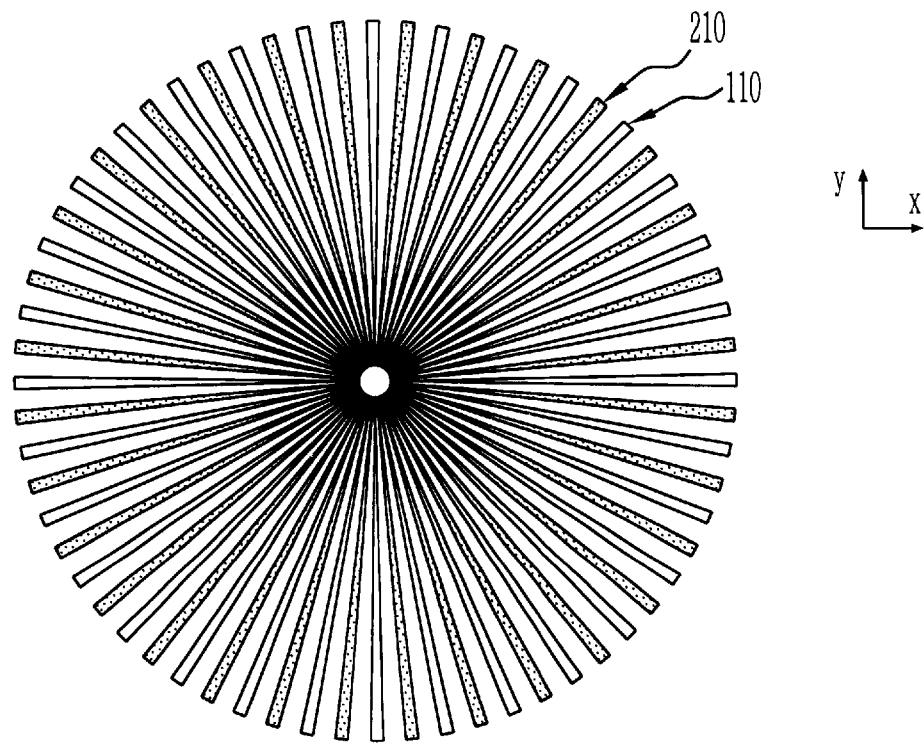
FIG. 4A to FIG. 4C show the shape of the measuring patterns formed on a wafer win the first and second mask according to the present invention are applied.
Figure 4B:
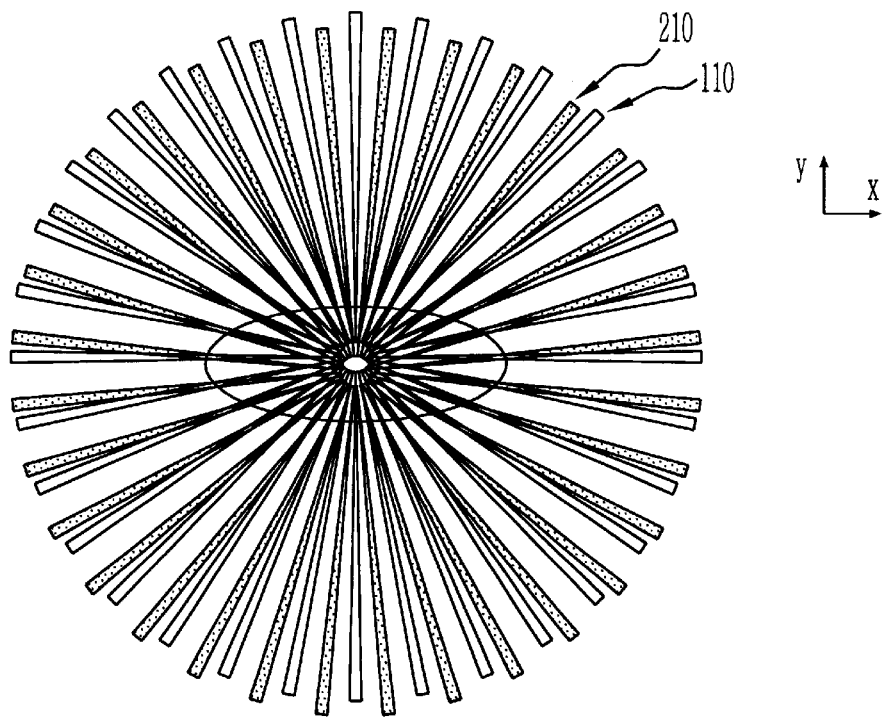
Figure 4C:
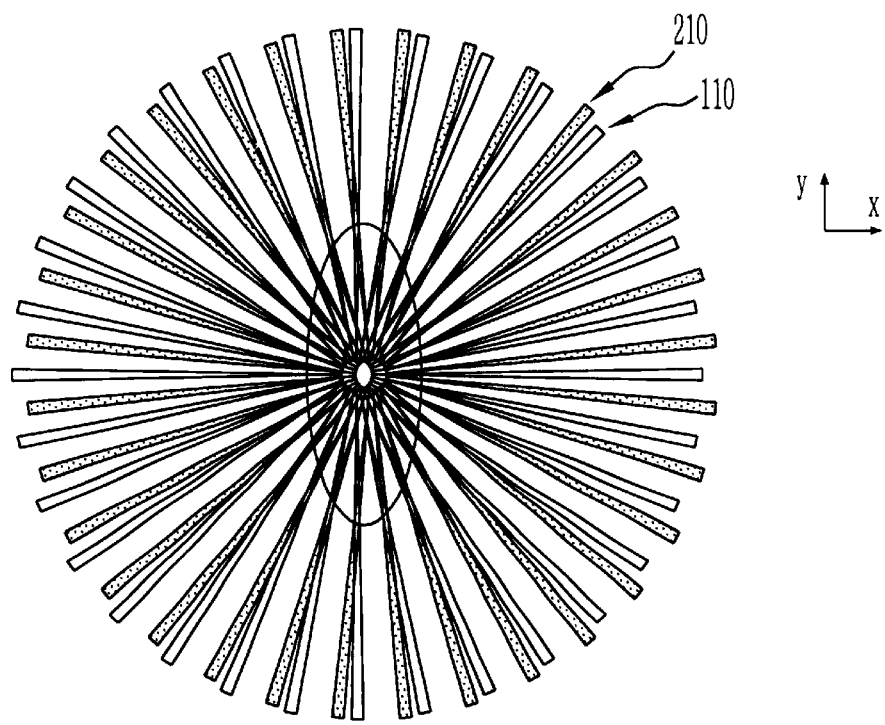

FIG. 4A to FIG. 4C show the shapes of the measuring patterns formed on a test wafer when a lithography process is performed by means of the first and second mask for measuring an overlapping error according to the present invention. In FIG. 4A, FIG. 4B and FIG. 4C, first measuring patterns 110 are formed on the test wafer by the first mask 10, and second measuring patterns 210 are formed on the test wafer by the second mask 20 in overlapped state.

FIG. 4A shows that the measuring error does not occurred, FIG. 4B shows that the measuring error occurs in direction of Y axis. And, FIG. 4C shows that the measuring error occurs in direction of X axis.

These measuring patterns 110 and 210 are noticeable through a microscope having a low magnifying power or a baked eye depending on the case. When two measuring patterns 110 and 210 are overlapped, they are greatly distorted in shape even for a fine overlapping error, therefore, it possible to easily identify an overlapping error. Additionally, deviation toward the X-axis and Y-axis direction or any direction can be also identified by shape of ellipse.

As shown in FIG. 4B and FIG. 4C, in case that an overlapping error occurs, the methods of calculating a value of the overlapping error and compensating will be explained as follows.

Figure 5A:
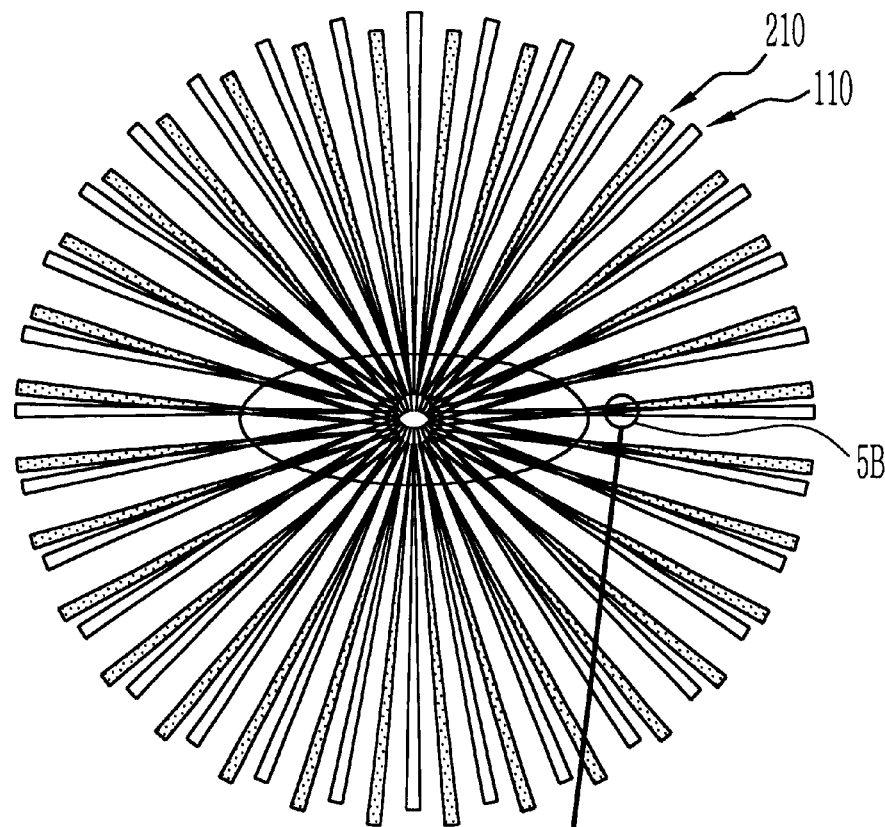
FIG. 5A illustrates the principles of calculating a value of an overlapping error.
Figure 5B:
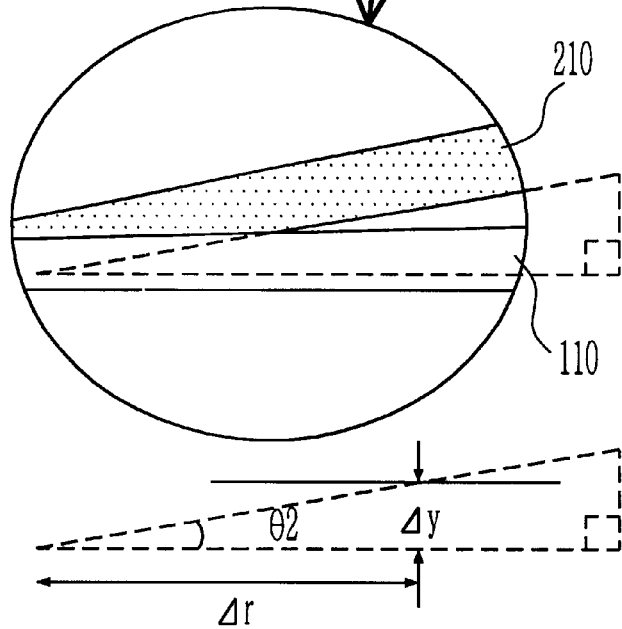
FIG. 5B is a detail view of a portion of 5B in FIG. 5A

FIG. 5A is a view for illustrating the principles of calculating a value of the overlapping error when the measuring patterns are deviated in direction of the Y-axis as shown in FIG. 4B, and FIG. 5B is a detail view of a portion of 5B in FIG. 5A.

A value of overlapping error is measured at the line of apsides of the ellipse in which two measuring patterns 110 and 210 are overlapped, and is calculated by the following Equation 1:

$$\Delta y = \Delta r \cdot \tan \theta_2 \quad (1)$$

When the first and second measuring patterns are deviated in direction of the X-axis as shown in FIG. 4C, a value of the overlapping error is calculated by the following Equation 2;

$$\Delta x = \Delta r \cdot \tan \theta_2 \quad (2)$$

wherein; $\Delta x$ and $\Delta y$ are values of actual overlapping error, $\Delta r$ is a distance from a central point of a circle to a cross point of the patterns 110 and 210; and $\theta_2$ is a deviation angle of the first and second measuring patterns 110 and 210.

Meanwhile, as the unit patterns 12 and 22 of the first and second masks 10 and 20 have a same shape, it is actually difficult to identify the measuring patterns 110 and 210. Therefore, the first and second measuring guides 120 and 220 are formed on the unit patterns 12 and 22 of the first and second masks 10 and 20, respectively in order to identify the first and second measuring patterns 110 and 220.

Figures 6A, 6B:
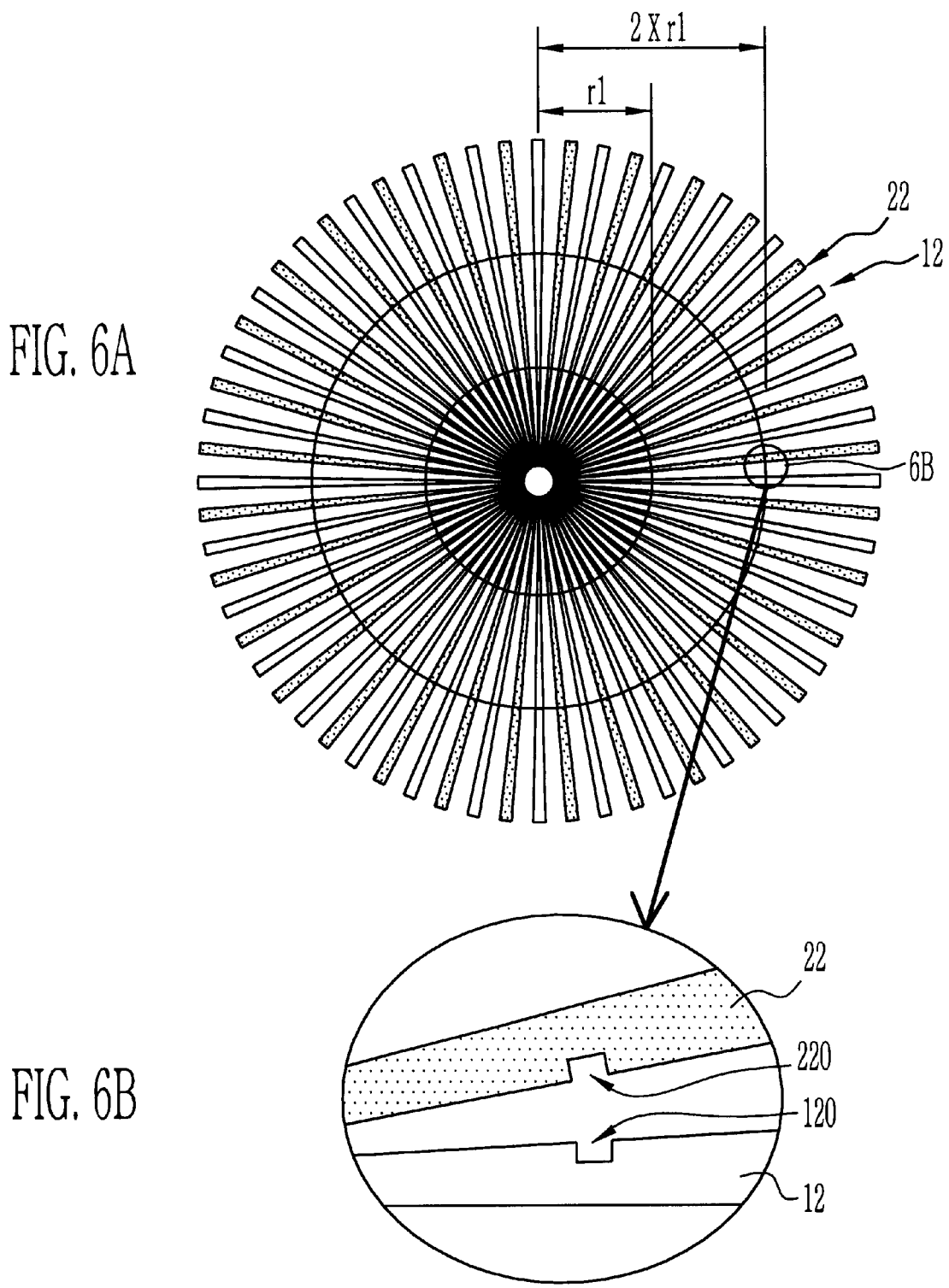
FIG. 6A shows measuring guides for identifying the measuring patterns.
FIG. 6B is a detail view of a portion of 6B in FIG. 5A.

At this time, the each first measuring guide 120 is formed on a left side of the each unit pattern 12 of the first mask 10, and the each second measuring guide 220 is formed on a right side of the each unit pattern 22 of the second mask 20, as shown in FIG. 6A and FIG. 6B. Therefore, the each first measuring guide 120 formed on the each unit pattern 12 and the each second measuring guide 220 formed on the each unit pattern 22 are faced each other.

As a result of the measurement, if the deviation degree of $\theta_2$ of the first and second measuring patterns 110 and 210 is 2.5°, the second measuring pattern 210 is deviated in direction of Y-axis, and the distance $\Delta r$ between the center and the cross point of the first and second measuring patterns 110 and 210 is 1.5 $\mu$m, a value of the overlapping error $\Delta y$ can be defined as follows:

$$\Delta y = 1.5 \ \mu m \times \tan 2.5°$$

$$= 0.0655 \ \mu m[+]$$

According to the present invention, an overlapping error can easily identified by a microscope or by a baked eye. Also, the overlapping errors generated in a directions of Y-axis and X-axis can be measured simultaneously.

The foregoing description, although described in its preferred embodiments with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A mask set for measuring an overlapping error, comprising:

a first mask consisted of a mask substrate on which a plurality of unit patterns are formed, said plurality of unit patterns arranged in a radial shape around a given center, each unit pattern of said first mask has a first measuring guide; and a second mask consisted of a mask substrate on which a plurality of unit patterns are formed, said plurality of unit patterns arranged in a same shape as said plurality of unit patterns of said first mask, each unit pattern of said second mask has a second measuring guide whereby when said first and second masks are overlapped to each other, said each unit pattern of said first mask and a neighboring unit pattern of said second mask maintain a certain angle.

2. The mask set of claim 1, said each unit pattern and said neighboring unit pattern of said unit pattern of the said first mask maintain an angle of between 0° and 90°.

3. The mask set of claim 1, said each unit pattern of said first mask and the neighboring unit pattern of said second mask maintain an angle of between 0° and 45°.

4. The mask set of claim 1, said unit patterns are dark patterns.

5. The mask set of claim 1, said unit patterns are clear patterns.

6. The mask set of claim 1, said first measuring guide formed on said each unit pattern of said first mask and said second measuring guide formed on said each unit pattern of said second mask are located at opposite portions, whereby said first measuring guide formed on said each unit pattern of said first mask and said second measuring guide formed on said unit pattern of said second mask face each other.

* * * * *